United States Patent
Peng

(10) Patent No.: US 8,432,230 B2
(45) Date of Patent: Apr. 30, 2013

(54) HIGH ACCURACY OSCILLATOR AND AN AUTO-TRIMMING METHOD THEREOF

(75) Inventor: Zhou Peng, Zhe Jiang Province (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 13/069,695

(22) Filed: Mar. 23, 2011

(65) Prior Publication Data

US 2011/0254634 A1   Oct. 20, 2011

(30) Foreign Application Priority Data

Mar. 23, 2010   (CN) .......................... 2010 1 0132503

(51) Int. Cl.
*H03L 7/00* (2006.01)
(52) U.S. Cl.
USPC ............... 331/25; 331/11; 331/27; 331/177 R
(58) Field of Classification Search .................... 331/11, 331/25, 27, 117 R, 167, 177 R; 327/156, 327/158
See application file for complete search history.

(56) References Cited

U.S. PATENT DOCUMENTS

| | | | |
|---|---|---|---|
| 5,831,482 A | 11/1998 | Salvi et al. | |
| 6,064,947 A | 5/2000 | Sun et al. | |
| 6,788,159 B2 * | 9/2004 | Takahashi et al. | 331/176 |
| 2003/0048139 A1 * | 3/2003 | Chien et al. | 331/11 |
| 2003/0224749 A1 * | 12/2003 | Uozumi et al. | 455/252.1 |
| 2005/0219003 A1 * | 10/2005 | Urakawa | 331/117 R |
| 2009/0195277 A1 * | 8/2009 | Yamakido et al. | 327/158 |
| 2010/0085121 A1 * | 4/2010 | Fievet et al. | 331/25 |
| 2010/0213984 A1 * | 8/2010 | Shin et al. | 327/105 |

FOREIGN PATENT DOCUMENTS

JP   2001-285056   10/2001

* cited by examiner

*Primary Examiner* — Joseph Chang
*Assistant Examiner* — Jeffrey Shin
(74) *Attorney, Agent, or Firm* — Stanzione & Kim, LLP

(57) ABSTRACT

A high-accuracy oscillator obtains initial control bits to generate an initial signal and generates adjacent control bits to generate an adjusted signal from the oscillator based on the adjacent control bits. Characteristics of the initial signal and the adjacent signal are compared to a preset value to determine which of the initial signal and the adjusted signal is closer to a target signal. The closer of the initial signal and the adjusted signal to the target signal is output from the oscillator.

24 Claims, 11 Drawing Sheets

HIGH ACCURACY OSCILLATOR AND AN AUTO-TRIMMING METHOD THEREOF

CROSS-REFERENCE TO RELATED APPLICATIONS

The present general inventive concept relates to a high accuracy oscillator and an auto-trimming (that is, auto calibrating) method thereof, more particularly, the present general inventive concept relates to a high accuracy oscillator with auto trimming function and an auto-trimming method for the high accuracy oscillator.

BACKGROUND

1. Field of the Invention

An existing oscillator circuit adjusts an oscillation frequency of the oscillator circuit by externally installing resistors and capacitors outside an integrated circuit encapsulating the oscillator circuit. Although the method of employing the externally installed resistors and capacitors to adjust the oscillation frequency can obtain oscillation frequency with a high degree of accuracy, the external installment of the resistors and capacitors will increase pins encapsulated in the integrated circuit, an area of the oscillator circuit, and a cost of the resistors and capacitors, so that the cost of the whole oscillator circuit increases.

2. Description of the Related Art

FIG. 1 is a view illustrating a conventional circuit for providing a clock to a chip 10 by using an external crystal CR. The circuit generates a clock for the chip 10 by using the externally connected external crystal CR and load capacitors C1 and C2, and an internal crystal driver circuit integrated in the chip 10.

Since the circuit illustrated in FIG. 1 uses a conventional crystal circuit to provide a clock for the chip 10, a separated crystal CR and external load capacitors C1 and C2 are necessary, and the cost increases. In addition, since two pins of the chip are occupied to externally connect the crystal circuit, the circuit illustrated in FIG. 1 is not adaptive to chips having few pins, which limits the scope of applications to which the circuit may be applied.

FIG. 2 illustrates an internal oscillator circuit 20, the oscillation frequency of which can be adjusted, and the internal oscillator circuit 20 generates a clock required by a chip by using a frequency control circuit 22 and an internal oscillator 24. The frequency control circuit 22 is used to generate control bits for the internal oscillator 24, and the internal oscillator 24 is used to generate different output frequencies according to different control bits. In order to obtain a required frequency, all of the bits can be scanned so as to obtain control bits which are close to a target frequency.

Although the circuit illustrated in FIG. 2 can control the frequency of the internal oscillator by using the frequency control circuit, times of scanning operations may be $2^N$ (N indicates a number of the control bits of the internal oscillator), so as to obtain an optimal result. Since time for scanning is so long, and numbers of control bits of different chips may be completely different from each other, the circuit illustrated in FIG. 2 is may not be able to be fixed or corrected after the circuit has been produced or manufactured.

FIG. 3A illustrates an internal oscillator circuit 30, the oscillation frequency of which can be auto-adjusted, and the internal oscillator circuit includes a frequency comparer 32, a Successive-Approximation-Register (SAR) comparer 34, and an internal oscillator 36. The frequency comparer 32 compares the current oscillation frequency of the internal oscillator circuit with a target frequency, and outputs a comparing result to the SAR comparer 34. The SAR comparer 34 determines to set a corresponding bit to 0 or 1 according to the comparing result.

FIG. 3B is a flowchart illustrating a method corresponding to the internal oscillator circuit, the oscillation frequency of which can be auto-adjusted. In operation 41, a selected bit K is set at N−1, where N−1 corresponds to a highest level bit of a plurality of bits. For example, if three control bits are used, then the highest level bit is N−1, the next level bit is N−2, and the lowest level bit is N−3. In operation 42 all the bits are set to 0. In operation 43, the Kth bit is set to 1. Consequently, the internal oscillator 36 generates a predetermined frequency (corresponding to the control bits 100, for example). In operation 44, the generated frequency Fosc is compared with a reference frequency Fref. If the generated frequency Fosc is greater than the reference frequency Fref, then the Kth bit is set to 0 (command bits are 000) in operation 46. Otherwise, the Kth bit is maintained at 1 in operation 45.

In operation 47, the Kth bit is set to K−1. In other words, the next lowest level bit is selected. In operation 48, it is determined whether K is less than 0, or if the last bit to be analyzed was the lowest level bit. If not, then the Kth bit is set to 1 (command bits may be set to 110 or 010, depending on outcome of previous analysis) and operations 43-48 are repeated. This operation is repeated until the value of the 0th bit, or lowest-level bit, is determined.

An internal oscillator having 3 control bits will be provided as an example by referring to the following Table 1, which illustrates a corresponding relationship between frequencies of the internal oscillator and control bits of the internal oscillator.

TABLE 1

| Control bits | 3'b000 | 3'b001 | 3'b010 | 3'b011 | 3'b100 | 3'b101 | 3'b110 | 3'b111 |
|---|---|---|---|---|---|---|---|---|
| frequencies | 6.4M | 6.9M | 7.4M | 7.8M | 8.1M | 8.5M | 9.0M | 9.6M |

Assuming that the frequency of a reference signal (hereinafter, referred to as the reference frequency) is same as a target frequency, both of the frequency of the reference signal and the target frequency may be 8 MHz. The method illustrated in FIG. 3B performs the following operations.

First, in operation 41, the greatest-level bit, or the second bit is selected as the Kth bit. Next, in operation 42, all the bits are set to 0. Then, in operation 43, the second bit of the control bits is set to 1. The value of the corresponding control bits is 3'b100, which corresponds to a frequency of 8.1 MHz. In operation 44 it is determined whether the generated frequency, 8.1 MHz, is greater than the target frequency, 8 MHz. Since the generated frequency is greater than the target frequency, in operation 46 the second bit is set again to 0, and the value of corresponding control bits at this time is 3'b000.

Next, in operation 47, the first bit of the control bits is set as the Kth bit. In operation 48 it is determined that 1 is not less than 0, and in operation 43 the first bit of the control bits is set to 1, and the value of corresponding control bits is 3'b010. Since the frequency corresponding to the value 3'b010 of the control bits is 7.4 MHz, then it is determined in operation 44 that the oscillation frequency of the internal oscillator is less than the target frequency. In operation 45, the first bit of the control bits is maintained at 1, and the value of corresponding control bits at this time is 3'b010.

In operation 47, the 0th bit of the control bits is selected, and in operation 48 it is determined that 0 is not less than 0. In operation 43, the 0th bit of the control bits is set to 1, and at this time the value of corresponding control bits is 3'b011, which corresponds to a frequency of 7.8 MHz. In operation 44 it is determined that the oscillation frequency of the internal oscillator is less than the target frequency, so in operation 45 the 0th bit of the control bits is maintained at 1, and the value of corresponding control bits at this time is 3'b011.

In operation 47, K is set to −1, and in operation 48 it is determined that −1 is less than 0, so the comparison of the 0th bit of the control bits is finished. The value of the finally auto-trimmed control bits is 3'b011, and the auto-trimmed frequency is 7.8 MHz.

The internal oscillator circuit illustrated in FIG. 3A can auto-trim frequencies, and the number of times of the scanning is only N (N indicates a number of the control bits of the internal oscillator). However, as illustrated above, the finally auto-trimmed frequency is 7.8 MHz. However, the frequency of 8.1 MHz is closer to the target frequency than the final frequency of 7.8 MHz. Therefore, the result obtained by using the method may not be the optimal result.

In order to save cost of design, more and more designs employ an internal oscillator, rather than an external clock circuit, to provide clocks. It is difficult to make internal oscillator frequencies of each chip to be identical due to differences of semiconductor manufacturing processes. In order to reduce the differences among chips, the internal oscillator frequencies are set to be available for adjusting. The internal oscillator frequencies are made to be approximately same with each other by setting the control bits of the internal oscillators.

SUMMARY

With respect to the above described problems existing in the related art, the present general inventive concept provides a high accuracy oscillator with an auto-trimming function and an auto-trimming method thereof, which can obtain a high accuracy oscillation signal by connecting an oscillator circuit internally without externally connecting an oscillator unit, reduce pins of a chip of the oscillator, and meet the application requirement of an integrated circuit.

Additional aspects and utilities of the present general inventive concept will be set forth in part in the description which follows and, in part, will be obvious from the description, or may be learned by practice of the present general inventive concept.

Features and/or utilities of the present general inventive concept may be realized by a high-accuracy oscillator with an auto-trimming function, the high-accuracy oscillator including an oscillator unit, which generates an oscillation signal, a frequency comparer, which receives the oscillation signal from the oscillator unit, and compares the frequency of a preset reference signal and the frequency of the oscillation signal based on a preset reference data, a Successive-Approximation-Register (SAR) comparer, which obtains initial control bits based on the comparing result of the frequency comparer, and a post process module, which generates adjacent control bits based on the initial control bits, selects one of the initial control bits and adjacent control bits as final control bits based on the preset reference data, and outputs the final control bits to the oscillator unit, wherein the oscillator unit performs auto-trimming based on the final control bits.

The frequency comparer may include a reference signal counter, which counts periods of the reference signal, an oscillation signal counter, which counts periods of the oscillation signal if a count value of the reference signal counter is less than a predetermined threshold M, until the count value of the reference signal counter reaches the predetermined threshold M, and the oscillation signal counter outputs a current count value, and a comparing unit, which receives the count value from the oscillation signal counter, and compares the count value with the preset reference data.

The SAR comparer may obtain the initial control bits by performing the following operations: letting a variable K=N−1, setting the Kth control bit to 1, and setting all bits of the 0th bit through the (K−1)th bit are set to 0, wherein N indicates a number of the control bits of the oscillator unit, setting the Kth control bit according to comparing result of the comparing unit: if the comparing result of the comparing unit is that the count value of the oscillation signal counter is greater than or equal to the preset reference data, maintaining the Kth control bit to 1, if the comparing result of the comparing unit is that the count value of the oscillation signal counter is less than the preset reference data, setting the Kth control bit to 0, letting K=K−1, and if K is greater than or equal to 0, repeating the above steps.

The SAR comparer may obtain the initial control bits by performing the following operations: letting a variable K=N−1, setting the Kth control bit to 1, and setting all bits of the 0th bit through the (K−1)th bit to 0, wherein N indicates a number of the control bits of the oscillator unit, comparing the frequency of the oscillation signal and the frequency of the reference signal, if the frequency of the oscillation signal is greater than the frequency of the reference signal, maintaining the Kth control bit to 1, if the frequency of the oscillation signal is less than the frequency of the reference signal, setting the Kth control bit to 0, letting K=K−1, if K is greater than or equal to 0, repeating the above operations.

The post process module may include a first comparer, which receives the count value from the oscillation signal counter in the frequency comparer, and compares the count value with the preset reference data, an adjacent control bits generating module, which generates the adjacent control bits by subtracting 1 from the initial control bits if the comparing result is that the count value is greater than the preset reference data, and generates the adjacent control bits by adding 1 to the initial control bits if the comparing result is that the count value is less than or equal to the preset reference data, a first register, which receives and stores the counter value of the oscillation signal counter corresponding to the initial control bits from the oscillation signal counter, transmits the stored count value to a second register when a predetermined time period after receiving the count value elapses, and receives the counter value of the oscillation signal counter corresponding to the adjacent control bits from the oscillation signal counter, a second register, which receives and stores the counter value of the oscillation signal counter corresponding to the initial control bits from the first register, a first calculator, which calculates an absolute value of a difference between the count value of the oscillation signal counter corresponding to the adjacent control bits and the preset reference data, a second calculator, which calculates an absolute value of a difference between the count value of the oscillation signal counter corresponding to the initial control bits and the preset reference data, and a second comparer, which compares values output from the first calculator and the second calculator, wherein if the value output from the first calculator is less than the value output from the second calculator, the adjacent control bits are selected as the final control bits, and if the value output from the first calculator is greater than or equal to the value output from the second calculator, the initial control bits are selected as the final control bits.

The preset reference data may be set as follows: Refdata=|M×$T_{REF}$/$T_{TAG}$|, wherein Refdata denotes the reference data, and is an integer, $T_{REF}$ denotes a period of the reference signal, $T_{TAG}$ denotes a target period of the oscillation signal, and M denotes the predetermined threshold.

The high accuracy oscillator further may include an encoder, which encodes the final control bits output by the post process module, a memory, which stores the encoded final control bits, a selector, which selects a source of the selected final control bits, so that the high accuracy oscillator obtains a desired frequency in a no-trimming status, a decoder, which decodes the final control bits output from the selector, and outputs the decoded final control bits to the oscillator unit.

If the high accuracy oscillator is in a trimming status, the selector may receive the encoded final control bits from the encoder, and if the high accuracy oscillator is in a no-trimming status, the selector may receive the final control bits from the memory.

Features and/or utilities of the present general inventive concept may also be realized by an auto-trimming method of a high accuracy oscillator is provided, the auto-trimming method including comparing a frequency of a preset reference signal and a frequency of an oscillation signal based on a preset reference data, generating initial control bits based on comparing result, and selecting one of the initial control bits and adjacent control bits as final control bits based on the preset reference data, wherein the oscillator unit performs auto-trimming based on the final control bits.

Comparing the frequency of a preset reference signal and the frequency of an oscillation signal based on a preset reference data may include counting periods of the reference signal by a reference signal counter, counting periods of the oscillation signal by an oscillation signal counter, if the count value of the reference signal counter is less than a predetermined threshold M, until the count value of the reference signal counter reaches a predetermined threshold M, and outputting a current count value by the oscillation signal counter, receiving the count value from the oscillation signal counter, and comparing the count value with the preset reference data.

Generating the initial control bits may include letting a variable K=N−1, setting the Kth control bit to 1, and setting all bits of the 0th bit through the (K−1)th bit to 0, wherein N indicates a number of the control bits of the oscillator unit, setting the Kth control bit according to the comparing result of the comparing step: if the comparing result of the comparing unit is that the count value of the oscillation signal counter is greater than or equal to the preset reference data, maintaining the Kth control bit to 1, if the comparing result of the comparing unit is that the count value of the oscillation signal counter is less than the preset reference data, setting the Kth control bit to 0, letting K=K−1, if K is greater than or equal to 0, repeating the above operations.

Generating the initial control bits may include letting a variable K=N−1, setting the Kth control bit to 1, and setting all bits of the 0th bit through the (K−1)th bit to 0, wherein N indicates a number of the control bits of the oscillator unit, comparing the frequency of the oscillation signal and the frequency of the reference signal, if the frequency of the oscillation signal is greater than the frequency of the reference signal, maintaining the Kth control bit to 1, if the frequency of the oscillation signal is less than the frequency of the reference signal, setting the Kth control bit to 0, letting K=K−1, and if K is greater than or equal to 0, repeating the above operations.

Generating the adjacent control bits may include receiving the count value from the oscillation signal counter, and comparing the count value with the preset reference data, generating the adjacent control bits by subtracting 1 from the initial control bits if the comparing result is that the count value is greater than the preset reference data, and generating the adjacent control bits by adding 1 to the initial control bits if the comparing result is that the count value is less than or equal to the preset reference data.

Selecting the final control bits may include calculating an absolute value of a difference between the count value of the oscillation signal counter corresponding to the initial control bits and the preset reference data, and calculating an absolute value of a difference between the count value of the oscillation signal counter corresponding to the adjacent control bits and the preset reference data, and comparing the two absolute values. If the absolute value of the difference between the count value of the oscillation signal counter corresponding to the initial control bits and the preset reference data is less than or equal to the absolute value of the difference between the count value of the oscillation signal counter corresponding to the adjacent control bits and the preset reference data, the initial control bits may be selected as the final control bits. If the absolute value of the difference between the count value of the oscillation signal counter corresponding to the initial control bits and the preset reference data is greater than the absolute value of the difference between the count value of the oscillation signal counter corresponding to the adjacent control bits and the preset reference data, the adjacent control bits may be selected as the final control bits.

The auto-trimming method of the high accuracy oscillator may further include encoding the final control bits by an encoder, storing the encoded final control bits by a memory, selecting the final control bits from the encoder and the memory by a selector, so that the high accuracy oscillator obtains a desired frequency in a no-trimming status, and decoding the final control bits output from the selector, and outputting the decoded final control bits to the oscillator.

If the high accuracy oscillator is in a trimming status, the selector may receive the encoded final control bits from the encoder, and if the high accuracy oscillator is in a no-trimming status, the selector may receive the final control bits from the memory.

The present general inventive concept provides a method and an apparatus for realizing a high accuracy internal oscillator. In trimming, initial control bits are obtained by a method of SAR comparing, and the count values corresponding to the initial control bits and the adjacent control bits are compared with the reference data respectively to select the final control bits, so that the high accuracy internal oscillator is realized, which meets a high requirement for the frequency of the oscillation signal. Meanwhile, a structure of a chip and its peripheral circuits are simplified by building a high accuracy internal oscillator in an integrated circuit chip, which reduces the costs and the pins of chip and brings convenience for further extending functions of the chip.

Features and/or utilities of the present general inventive concept may also be realized by a method of controlling an oscillator, the method including determining initial control bits to generate an initial frequency by counting oscillation periods of the oscillator over a predetermined period of time, generating adjacent control bits by changing a value of the initial control bits by one bit, determining which of the initial frequency and an adjusted frequency corresponding to the adjacent control bits is closer to a target frequency, and setting the closer of the initial frequency and the adjusted frequency as an operating frequency of the oscillator.

Determining the initial control bits may include setting each control bit to a value of 1 in order from highest-level to lowest-level control bit, generating a signal corresponding to the set control bit, and determining whether to maintain the set control bit at 1 or to change the control bit to 0 by comparing the counted oscillation periods of the generated signal with a predetermined number of oscillation periods.

Generating adjacent control bits may include comparing the number of counted oscillation periods with a preset count number corresponding to the target frequency, and adding a bit to the initial control bits when it is determined that the number of counted oscillation periods is less than or equal to the preset count number, and subtracting a bit from the initial control bits when it is determined that the number of counted oscillation periods is greater than the preset count number.

Determining which of the initial frequency and the adjusted frequency is closer to the target frequency may include generating an adjusted oscillation signal with the adjacent control bits, counting an adjusted number of oscillation periods over the predetermined period of time, calculating an absolute value of the preset count number subtracted from the number of counted oscillation periods corresponding to the initial control bits, and obtaining an absolute value of the preset count number subtracting the adjusted number of oscillation periods.

Features and/or utilities of the present general inventive concept may also be realized by a method of controlling an oscillator, the method including setting each control bit to a value of 1 in order from highest-level to lowest-level control bit, respectively, where the control bits control a frequency of a signal output from the oscillator, generating a signal corresponding to the set control bit, and determining whether to maintain the set control bit at 1 or to change the control bit to 0 by comparing the number of counted oscillation periods of the generated signal with a predetermined number of oscillation periods.

Determining whether to maintain the set control bit at 1 or to change the control bit to 0 may include setting a threshold number to correspond to a target frequency, counting a number of periods of a reference signal and generating the signal corresponding to the set control bit while the number of periods of the reference signal is less than the threshold number, and determining the number of counted oscillation periods of the generated signal when the counted number of periods of the reference signal reaches the threshold number, comparing the number of counted oscillation periods of the generated signal with a preset number corresponding to the target frequency, and maintaining the set bit as a 1 when the number of counted oscillation periods of the generated signal is greater than or equal to the preset number, and setting the set bit to 0 when the number of counted oscillation periods of the generated signal is greater than the preset number.

Features and/or utilities of the present general inventive concept may also be realized by an oscillator circuit including an oscillator, a frequency comparer to count a number of oscillation periods of a signal output by the oscillator over a predetermined period of time, and a Successive-Approximation-Register (SAR) comparer to determine initial control bits to generate an initial frequency according to the counted number of oscillation periods of the frequency comparer.

The oscillator circuit may further include a post process module to generate adjacent control bits by changing a value of the initial control bits by one bit, to determine which of the initial frequency and an adjusted frequency corresponding to the adjacent control bits is closer to a target frequency, and to set the closer of the initial frequency and the adjusted frequency as an operating frequency of the oscillator.

The post process module may include an adjacent control bits generating module to receive the initial control bits and to output the adjacent control bits, a first calculator to calculate an absolute value of a difference between the counted number of oscillation periods of the signal output by the oscillator and a preset number corresponding to the target frequency, a second calculator to calculate an absolute value of a difference between an adjusted counted number of oscillation periods of an adjusted signal output by the oscillator corresponding to the adjacent control bits and the preset number, and a comparer to determine which of the calculated absolute values is smaller and to output one of the initial control bits and the adjacent control bits according to the determination of which of the calculated absolute values is smaller.

Features and/or utilities of the present general inventive concept may also be realized by a microchip including an oscillator circuit including an oscillator, a frequency comparer to count a number of oscillation periods of a signal output by the oscillator over a predetermined period of time, and a Successive-Approximation-Register (SAR) comparer to determine initial control bits to generate an initial frequency according to the counted number of oscillation periods of the frequency comparer.

BRIEF DESCRIPTION OF THE DRAWINGS

The above and other objects and features of the present general inventive concept will become more apparent by describing in detail exemplary embodiments thereof in conjunction with the drawings, in which.

DETAILED DESCRIPTION OF THE EMBODIMENTS

Figure 1:
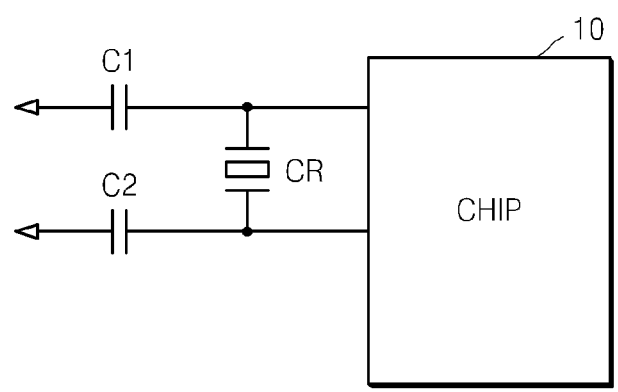
FIG. 1 is a view illustrating a conventional circuit for providing a clock to a chip by using an external crystal.
Figure 2:
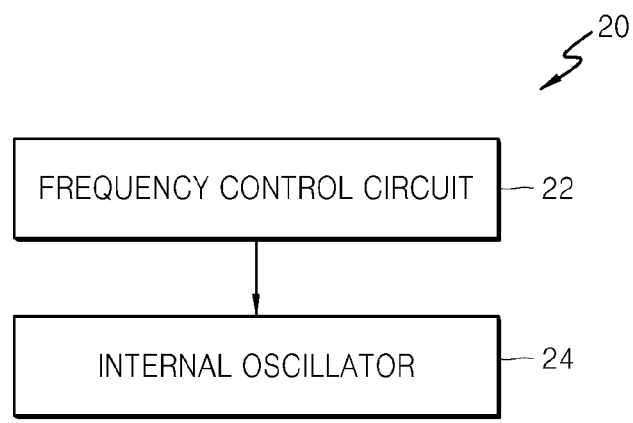
FIG. 2 illustrates an internal oscillator circuit.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 4:
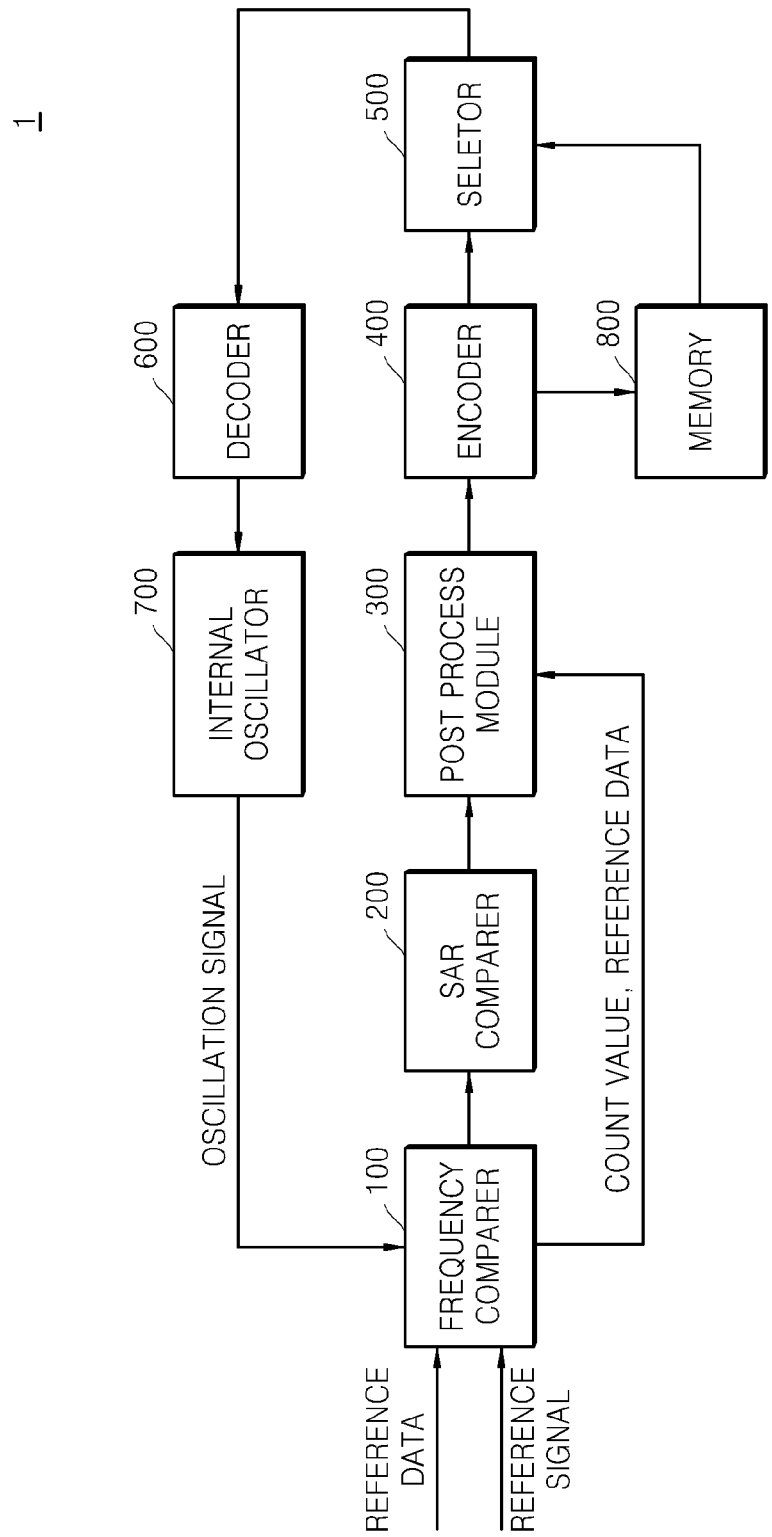
FIG. 4 is a view illustrating a high-accuracy oscillator having a trimming circuit according to an exemplary embodiment of the general inventive concept.

FIG. 4 is a view illustrating a high accuracy oscillator having a trimming circuit according to an exemplary embodiment of the present general inventive concept. The high accuracy oscillator includes a frequency comparer 100, an SAR comparer 200, a post process module 300, an encoder 400, a selector 500, a decoder 600, an internal oscillator 700, and a memory 800.

A preset reference signal and reference data are input into the frequency comparer 100, and an oscillation signal output by the internal oscillator 700 is also input into the frequency comparer 100. The reference data is a value that corresponds to a desired frequency of the internal oscillator 700. The frequency comparer 100 is used to compare a current frequency and a target frequency of the internal oscillator 700. The frequency comparer 100 compares a frequency of the reference signal with the oscillation frequency of the oscillation signal based on the reference data. However, since it is difficult to compare the current frequency (that is, oscillation frequency of the oscillation signal) of the internal oscillator 700 with the target frequency of the internal oscillator 700, a frequency comparison is converted to a time domain comparison by using the reference data. The operations of the frequency comparer 100 will be described by referring to FIG. 5 in detail. Herein, it should be note that, the reference signal and the oscillation signal mentioned in the present general inventive concept are clock signals.

Figure 5:
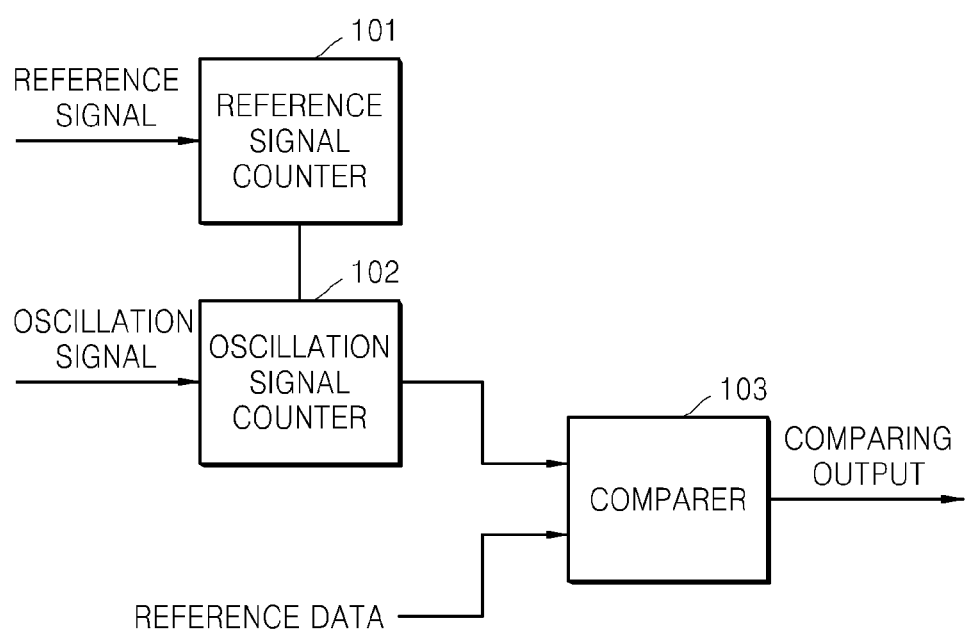
FIG. 5 is a block diagram illustrating a detailed structure of the frequency comparer 100 according to an exemplary embodiment of the present general inventive concept.

FIG. 5 is a block diagram illustrating a structure of the frequency comparer 100 in detail. By referring to FIG. 5, the frequency comparer 100 includes a reference signal counter 101, an oscillation signal counter 102 and a comparer 103. Herein, the reference signal counter 101 and the oscillation signal counter 102 can be implemented by using a D trigger and a corresponding logic circuit, for example.

As described above, since it is difficult to compare the current frequency (that is, oscillation frequency of the oscillation signal) of the internal oscillator 700 with the target frequency of the internal oscillator 700, the frequency comparison is converted to a time domain comparison by using the reference data. That is, the relation between the current frequency and target frequency of the internal oscillator can be determined by comparing a count value of the oscillation signal counter 102 with the reference data.

The reference data can be determined according to a target period T_TAG of the internal oscillator 700. Preferably, the reference data Refdata=|M×$T_{REF}$/$T_{TAG}$|, wherein Refdata denotes the reference data and is an integer; M denotes a predetermined threshold for the reference signal counter 101; $T_{REF}$ denotes a period of the reference signal; $T_{TAG}$ denotes a target period of the oscillation signal. For example, if the threshold M is set to 512, the period of the reference signal $T_{REF}$ is 100 ns, and the target frequency output by the internal oscillator is 8 MHz, to which the corresponding period is 125 ns, the value of Refdata is calculated as follows: 512×100 ns/125 ns=409.6, and the result of rounding 409.6 is 410, that is, Refdata is set to 410. How to set the threshold M will be described by referring to FIG. 7 later.

It will be described how to compare the current frequency (that is, oscillation frequency of the oscillation signal) and target frequency of the internal oscillator 700 by using the reference data below.

The reference signal counter 101 counts the periods of the reference signal. When the count value of the reference signal counter 101 is less than the threshold M, the reference signal counter 101 outputs a high level, and the oscillation signal counter 102 keeps counting. When the count value of the reference signal counter 101 reaches the threshold M, the reference signal counter 101 outputs a low level, and the oscillation signal counter 102 stops counting, and retains a current count value (hereinafter, a final count value of the oscillation signal counter 102 is referred to as N). At this time, the count value N of the oscillation signal counter 102 is compared with the reference data, so as to determine the value of the Kth bit of the control bits. The oscillation signal counter 102 and the reference signal counter 101 will be reset to 0 before the next comparison.

That is, the count value of the oscillation signal counter 102 within a certain time period (Tref×M) will be output to the comparer 103. The comparer 103 compares the count value with the reference data, and outputs the comparing result to the SAR comparer 200.

It will be described the operation principles of the reference signal counter 101 and the oscillation signal counter 102 illustrated in FIG. 5 below.

Figure 6:
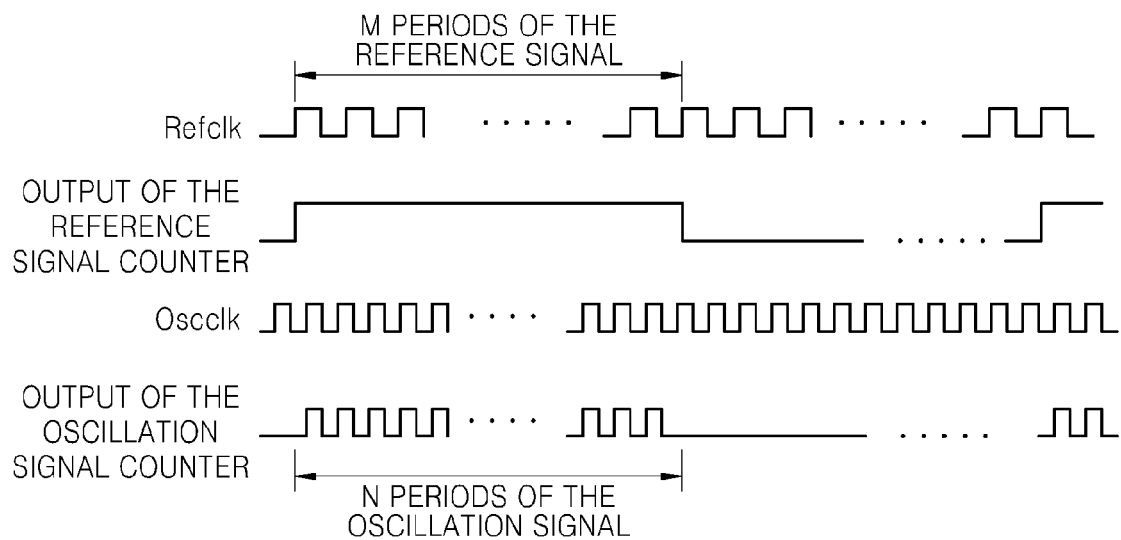
FIG. 6 is a waveform for illustrating the operation principles of a reference signal counter and an oscillation signal counter according to an exemplary embodiment of the present general inventive concept.

FIG. 6 is a waveform for illustrating the operation principles of the reference signal counter 101 and the oscillation signal counter 102. In FIG. 6, the first waveform illustrated by Refclk is a waveform of the reference signal, and the second waveform is a waveform of a signal output by the reference signal counter 101, the third waveform illustrated by Oscclk is a waveform of a clock signal of the internal oscillator, and the fourth waveform is a waveform of a signal output by the oscillation signal counter 102.

By referring to FIG. 6, the reference signal counter 101 counts the periods of the reference signal Refclk. The time period, during which the reference signal counter 101 outputs a high level, is M periods of the reference signal Refclk. During the M periods of the reference signal Refclk, the oscillation signal counter 102 counts the N periods of the oscillation signal Oscclk. While the count value of the reference signal counter 101 is less than the threshold M, the oscillation signal counter 102 continues counting. When the count value of the reference signal counter 101 reaches the threshold M, the oscillation signal counter 102 stops counting the periods of the oscillation signal Oscclk and the reference signal Refclk.

The oscillation signal counter 102 counts based on the output of the reference signal counter 101. On the assumption that the period of the input reference signal is $T_{REF}$, and the period of the oscillation signal is $T_{OSC}$, the count value of the oscillation signal counter 102 is calculated as follows: N=M×$T_{REF}$/$T_{OSC}$.

Figure 7:
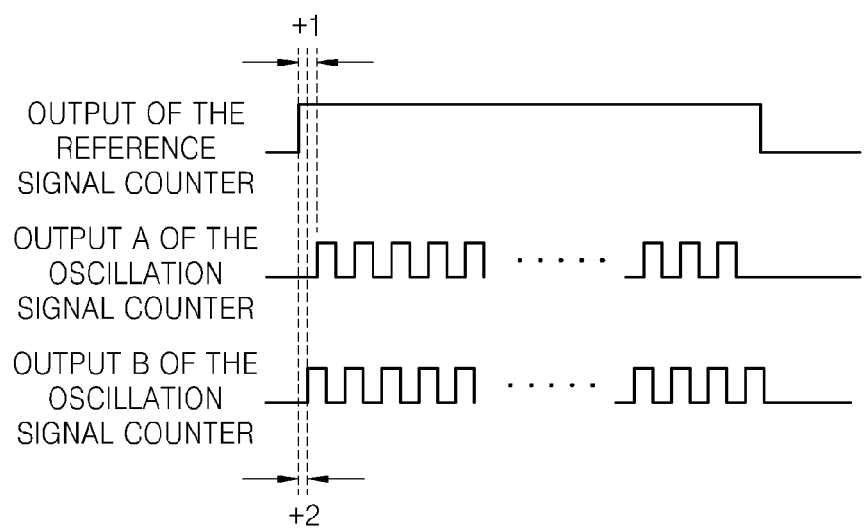
FIG. 7 is a waveform for illustrating the relation between the output of the reference signal counter and the output of the oscillation signal counter illustrated in FIG. 5 according to an exemplary embodiment of the present general inventive concept.

Hereinafter, it will be described to set the threshold M according to the target accuracy and the target frequency by referring to the relation between the output of the reference signal counter 101 and the output of the oscillation signal counter 102 as illustrated in FIG. 7.

FIG. 7 is a waveform for illustrating the relation between the output of the reference signal counter 101 and the output of the oscillation signal counter 102.

As illustrated in FIG. 7, since the output of the reference signal counter 101 is not counted in synchronism with the counting of the oscillation signal counter 102, after the reference signal counter 101 outputs a high level, a time period t1 may be required for the clock output by the oscillation signal counter 102 to reach the rising edge (the output A of the oscillation signal counter 102, as illustrated in FIG. 7), or the clock can reach the rising edge immediately or after a shorter delay t2 (the output B of the oscillation signal counter 102, as illustrated in FIG. 7). Therefore, an error occurs in the counting of the oscillation signal counter 10, but the error cannot be more than 2 periods of the oscillation signal. If the target accuracy is 1%, the counts of the oscillation signal counter 102 within a time period, during which the reference signal counter 101 outputs a high level, may reach at least 202. If the frequency of the reference signal is 10 MHz, and the target frequency of the internal oscillator is 1 MHz, then the threshold M is set to at least 2020. On the other hand, if the target frequency of the internal oscillator is 20 MHz, the threshold M may be set to at least 101. Therefore, with respect to different target frequencies of the internal oscillator, a trimming time is determined by setting a different threshold M. According to the exemplary embodiment of the general inventive concept, the threshold M is set according to the target accuracy and the target frequency, which differs from setting the threshold M to a constant in the related art.

The frequency comparer 100 outputs the reference data and the count value of the oscillation signal counter 102 to the post process module 300, and outputs the final comparing result of the frequency comparer 100 to the SAR comparer 200.

Figure 3A:
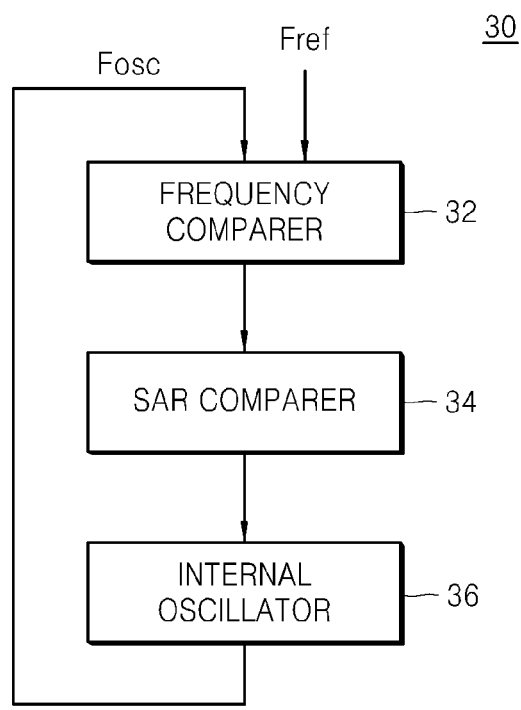
FIG. 3A illustrates an internal oscillator circuit.
Figure 3B:
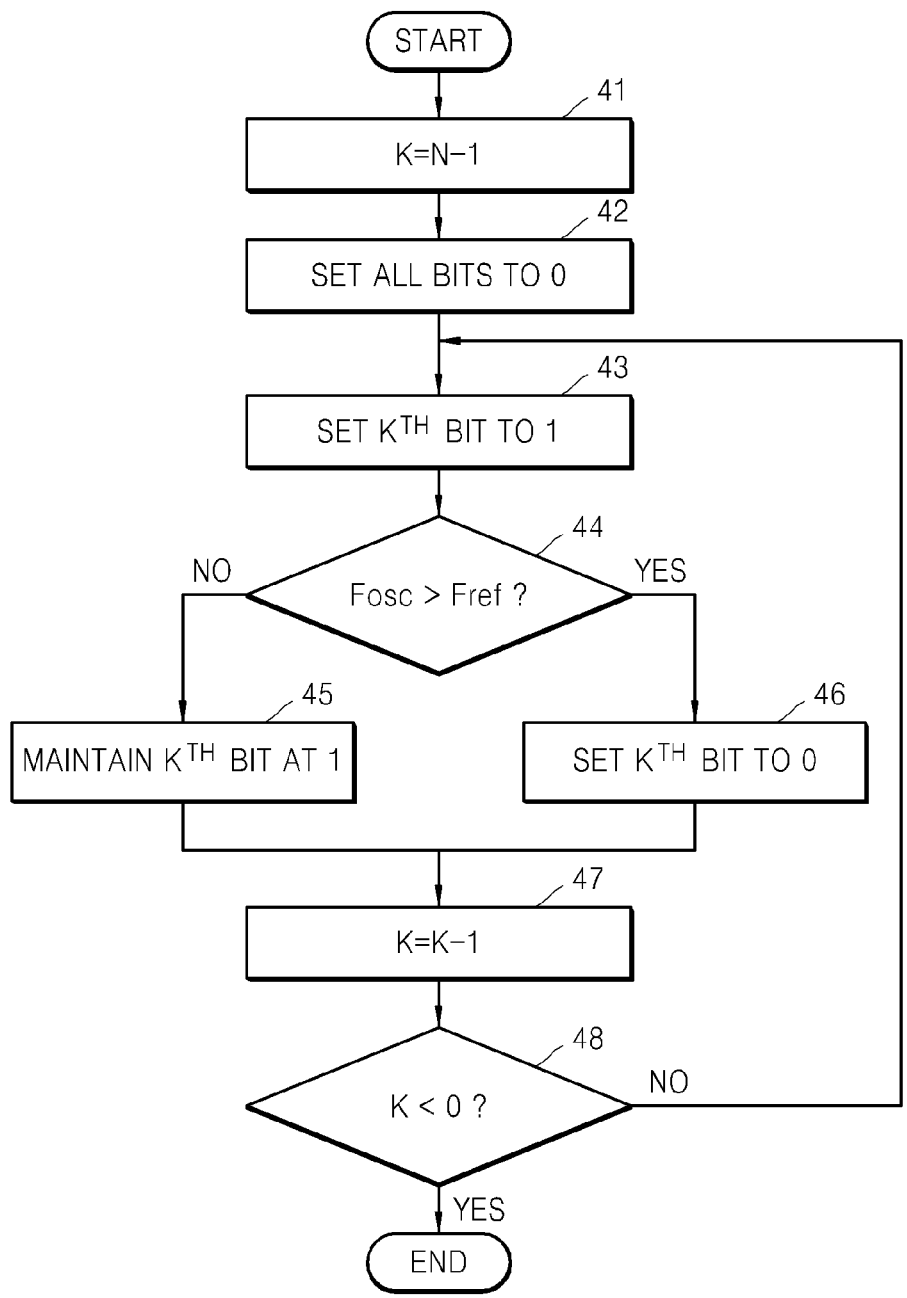
FIG. 3B is a flowchart illustrating a method corresponding to the internal oscillator circuit, the oscillation frequency of which can be auto-adjusted.

The SAR comparer 200 sets control bits according to the comparing result of the frequency comparer 100. By referring to FIG. 3B, the operations of the SAR comparer 200 are similar to those of setting the Kth bit to 0 or 1 according to comparing result, as illustrated in FIG. 3B. However, the operation of the SAR comparer 200 describe in FIG. 10, for example, differs from that of FIG. 3B inasmuch as the method of FIG. 3B sets the value of the Kth bit based on the comparing result of the oscillation frequency of the oscillation signal and the target frequency, while the SAR comparer 200 according to the exemplary embodiment of the present general inventive concept sets the value of the Kth bit based on the comparing result related to the oscillation frequency, the reference frequency, and the reference data, where the reference data is a value that corresponds to a desired frequency. In particular, the value of the Kth bit is determined by comparing a number of the periods of the oscillation signal within M periods of the reference signal with the reference data.

Figure 10:
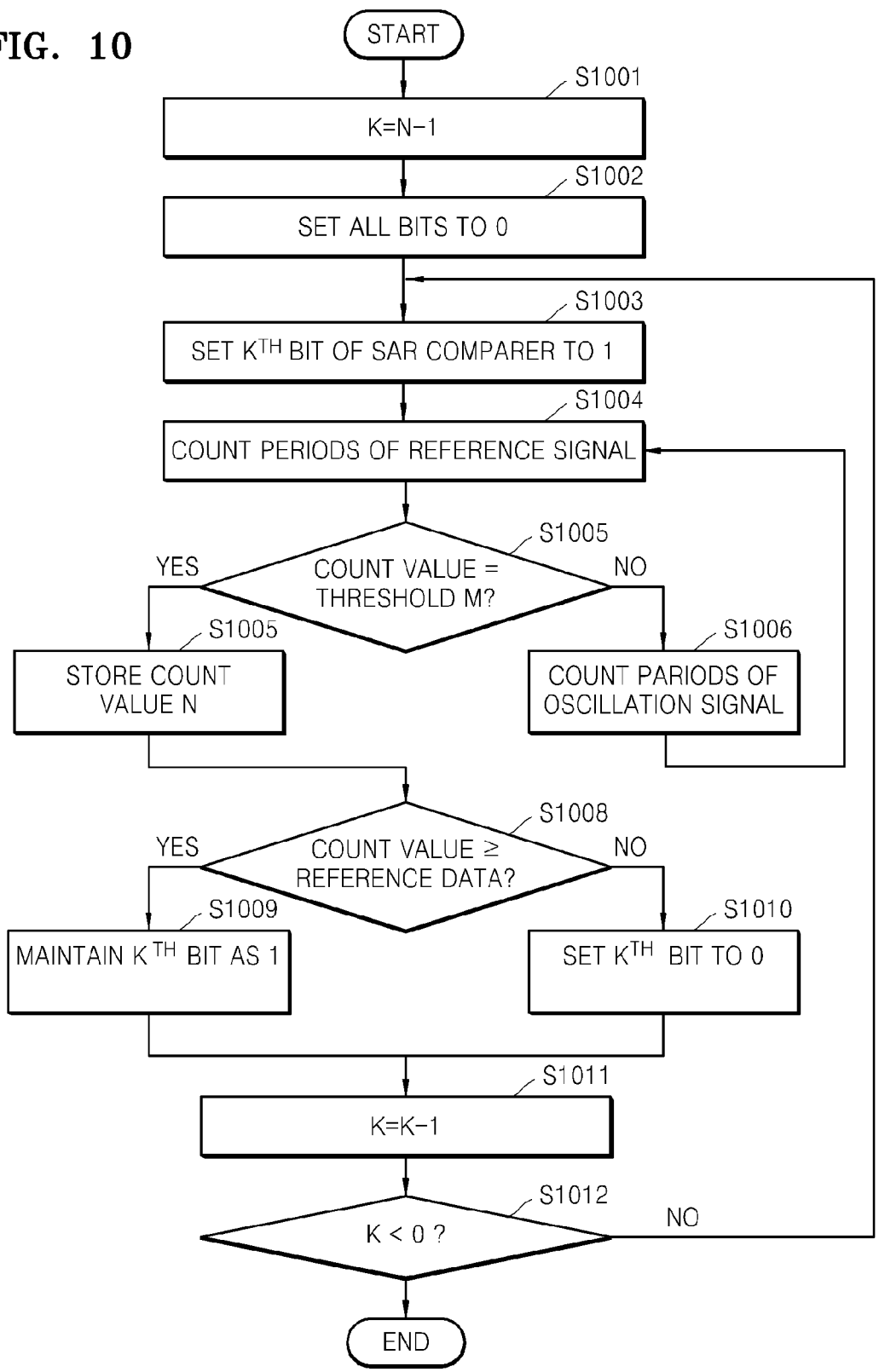
FIG. 10 is a flowchart illustrating the operation of obtaining initial control bits in FIG. 9 in details according to an exemplary embodiment of the present general inventive concept.

After determining the value of the Kth bit, the SAR comparer 200 sets K to K−1 and performs a loop operation, so as to generate initial control bits, as illustrated in FIG. 10, which will be discussed in greater detail below. The SAR comparer 200 outputs the count value of the oscillation signal counter 102, which corresponds to the generated initial control bits, to the post process module 300.

The post process module 300 according to the exemplary embodiment of the present general inventive concept will be described by referring to FIG. 8 as follows.

Figure 8:
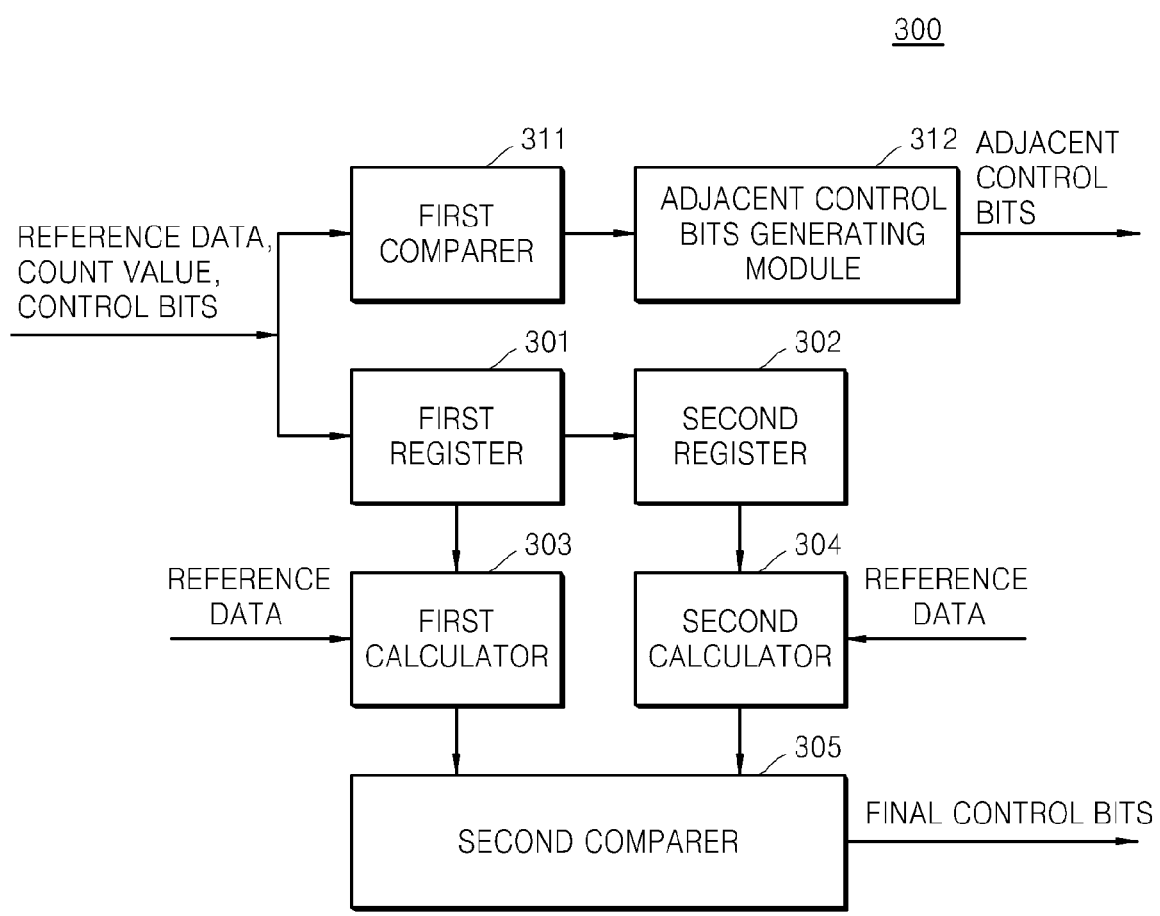
FIG. 8 is a view illustrating a post process module according to an exemplary embodiment of the present general inventive concept.

As illustrated in FIG. 8, the post process module 300 includes a first comparer 311, an adjacent control bits generating module 312, a first register 301, a second register 302, a first calculator 303, a second calculator 304, and a second comparer 305.

The first comparer 311 receives the generated control bits from the SAR comparer 200 as the initial control bits, and receives the reference data and a count value of the oscillation signal counter 102, which corresponds to the initial control bits, from the frequency comparer 100. The first comparer 311 compares the above count value with the reference data, and outputs the comparing result to the adjacent control bits generating module 312. The adjacent control bits generating module 312 sets the adjacent control bits according to the comparing result output by the first comparer 311. If the comparing result shows that the count value corresponding to the initial control bits is greater than the reference data, the adjacent control bits generating module 312 sets the adjacent control bits by subtracting 1 from the initial control bits. If the comparing result shows that the count value corresponding to the initial control bits is less than or equal to the reference data, the adjacent control bits generating module 312 sets the adjacent control bits by adding 1 to the initial control bits.

In other words, in the present specification and claims, "adjacent bits" or "adjacent control bits" refer to values of bits. For example, if initial control bits are set to 011, then one of the values 100 and 010 may be output as the "adjacent bits," according to the present specification and claims. Similarly, if the initial control bits are set to 101, then one of the values 110 and 100 may be output as the "adjacent bits" according to the present specification and claims. As discussed above, the adjacent control bits (i.e. bit values corresponding to a higher bit value than the initial control bits or a lower bit value) are determined according to whether the count value corresponding to the initial control bits is greater than or less than reference data, where the reference data is a count value corresponding to a desired oscillator frequency.

Then the adjacent control bits generating module 312 outputs the obtained adjacent control bits to the internal oscillator 700. The adjacent control bits generating module 312 can directly output the adjacent control bits to the internal oscillator 700, or it can output the adjacent control bits to the internal oscillator 700 in a signal path as illustrated in FIG. 4. The internal oscillator 700 oscillates according to the adjacent control bits, so as to obtain a frequency corresponding to the adjacent control bits. Then, as illustrated in FIG. 5, the oscillation signal counter 102 counts periods of the oscillation signal corresponding to the above frequency, and finally outputs the count value (that is, the count value corresponding to the adjacent control bits) to the post process module 300.

While performing the above operations, the first register 301 receives the count value of the oscillation signal counter 102, which corresponds to the adjacent control bits, from the frequency comparer, and stores the count value.

After a predetermined time period elapses, during which the internal oscillator 700 oscillates according to the adjacent control bits to generate a oscillation signal and the oscillation signal counter 102 counts periods of the oscillation signal, the count value of the oscillation signal counter 102, which is stored in the first register 301 and corresponds to the initial control bits, is transmitted to the second register 302, and the count value currently received from the frequency comparer 100, which corresponds to the adjacent control bits, is stored in the first register 301, as a count value of the oscillation signal counter 102, which corresponds to the adjacent control bits.

That is, the count value finally stored in the first register 301 is the count value of the oscillation signal counter 102, which corresponds to the adjacent control bits, and the count value finally stored in the second register 302 is the count value of the oscillation signal counter 102, which corresponds to the initial control bits. That is, the first register 301 stores a count value corresponding to the adjacent control bits, and the second register 302 stores a count value corresponding to the initial control bit.

Then, the first calculator 303 subtracts the reference data from the data stored in the first register 301 (the data is the count value of the oscillation signal counter 102, which corresponds to the adjacent control bits), gets the absolute value of the subtracted result, and outputs the absolute value to the second comparer 305. The second calculator 304 subtracts the reference data from the data stored in the second register 302 (the data is the count value of the oscillation signal counter 102, which corresponds to the initial control bits), gets the absolute value of the subtracted result, and outputs the absolute value to the second comparer 305.

The second comparer 305 compares the data output from the first calculator 303 with the data output from the second calculator 304, so that the final control bits can be selected according to the comparing result of the second comparer 305. In particular, if the data output from the first calculator 303 is less than the data output from the second calculator 304 (that is, the count value corresponding to the adjacent control bits is closer to the reference data than the count data corresponding to the initial control bits), the adjacent control bits are selected as the final control bits. On the other hand, if the data output from the second calculator 304 is less than the data output from the first calculator 303 (that is, the count value corresponding to the initial control bits is closer to the reference data than the count data corresponding to the adjacent control bits), the initial control bits are selected to be the final control bits.

The encoder 400 receives the final control bits from the post process module 300, encodes the final control bits, and outputs the encoded final control bits to the memory 800 and the selector 500.

The memory 800 is used to store the final control bits, and may be flash memory, ROM and EEROM etc.

The selector 500 is used to select a source of the control bits of the internal oscillator 700. In a trimming status, the control bits of the internal oscillator 700 are output from the encoder 400. In a non-trimming status, the control bits of the internal oscillator 700 are output from the memory 800. That is, the control bits of the internal oscillator 700 come from a trimming circuit only in the trimming status, and the control bits are read from the memory 800 in a general case.

The decoder 600 decodes the control bits output from the selector 500.

The internal oscillator 700 is a frequency adaptive oscillator. For explaining conveniently, the frequency of the internal oscillator illustrated in the present general inventive concept increases as the value of the control bits increase. The input of the internal oscillator 700 is decoded control bits generated by the decoder 600, and the output of the internal oscillator 700 is an oscillation frequency corresponding to the control bits, that is, the final frequency output as required by the present application.

The above description has described the configuration and the operation flowchart of the trimming circuit of the high-accuracy oscillator, but those skilled in the art should understand that not each of the elements described above must be present according to the general inventive concept. Regarding to different technical problems, configurations and connection relations of the elements will be different.

For example, the encoder 400 encodes the final control bits generated by the post process module 300, and stores the encoded final control bits into the memory 800 after trimming. While trimming, the encoder 400 outputs the encoded final control bits to the selector 500. The encoder and the decoder may be used when it is desired that the control bits of the internal oscillator are the corresponding bits stored in the memory 800 upon the oscillator being normally used (that is, in a non-trimming status). With respect to cases where no high accuracy is required (that is, in cases that no trimming is needed), it is desired that a frequency adjacent to the target frequency is generated after erasing the memory 800. However, since all bits of a memory after being erased are a fixed value (for example, 1) for a conventional memory (such as the flash memory), the encoder and decoder are used to ensure the memory 800 can generate an output adjacent to the target frequency after being erased. For example, with respect to a case where 3 control bits are used, if all of the values of the control bits of the memory are 1 after the memory being erased, and the desired output is 8 MHz, the actual control bits after passing the encoder and the decoder is 3'b011, so that the output of 7.8 MHz can be obtained without trimming. In an actual trimming process (in a trimming status), the control bits of the internal oscillator 700 are output from the SAR comparer 200 or the post process module 300, and then encoded and decoded. Finally the value of the control bits input into the internal oscillator 700 is maintained as it is. That is, if improved accuracy of the oscillation frequency of the internal oscillator is not desired, the encoder 400, the selector 500, the decoder 600, and the memory 800 need not necessarily be included.

In addition, the frequency comparer 100 can also be incorporated into the SAR comparer 200, that is, the frequency comparer 100 and the SAR comparer 200 may also be replaced with one SAR comparing circuit, wherein this SAR comparing circuit is different with a conventional SAR comparer. The frequency comparer 100 according to exemplary embodiments of the present general inventive concept will be described by referring to FIG. 5 in detail.

In order to explain the present general inventive concept more clearly, an internal oscillator having 3 control bits will be described in detail in following.

As described above, since the reference data is defined as Refdata=$|M \times T_{REF}/T_{TAG}|$, on the assumption that the reference frequency is 10 MHz, the value of the reference signal counter M is 512, and the target frequency is 8 MHz, the reference data is obtained as follows: Refdata=$|100\ ns \times 512/125\ ns|=|409.6|=410$.

Since there is a relation T_Ref×M=T_osc×N, that is, N=T_Ref×M/T_osc, wherein T_Ref indicates a period of the reference signal, and M is the count value of the reference signal counter 101, T_osc indicates a period of the current oscillation signal of the internal oscillator, and N is the count value of the oscillation signal counter.

The corresponding relation is illustrated in Table 2.

TABLE 2

| control bits | 3'b000 | 3'b001 | 3'b010 | 3'b011 | 3'b100 | 3'b101 | 3'b110 | 3'b111 |
|---|---|---|---|---|---|---|---|---|
| oscillation frequency | 6.4M | 6.9M | 7.4M | 7.8M | 8.1M | 8.5M | 9.0M | 9.6M |
| N | 328 | 353 | 379 | 399 | 415 | 435 | 461 | 492 |

Wherein, the oscillation frequency indicates a frequency of the oscillation signal generated by the internal oscillator 700 under the control of corresponding control bits.

Using the example of the three-bit control bits, the auto-trimming process is described as follows, with reference to FIG. 10.

In operation S1001, K is set to N−1, or in the case of the three-bit control bits, K is set to be 2, which corresponds to the second bit, or the highest-level bit. In operation S1002 all the bits are set to have values of 0. In operation S1003, the second bit is set to have a value of 1. The control bits of 3'b100 correspond to an oscillation frequency of 8.1 MHz.

In operation S1004, the periods of the reference signal are counted until it is determined in operation S1005 that the threshold M has been reached. In operation S1007 the value N, corresponding to the number of periods of the oscillation signal during the period of time corresponding to M periods of the reference signal is stored. In other words, during a time period of T_Ref×M (this time period is referred to as the reference time), the count value of the oscillation signal counter is 415. In operation S1008, it is determined whether the count value N is greater than or equal to reference data, which corresponds to a desired frequency. Since the count value of 415 is greater than the reference data 410, the Kth bit is set to 0 in operation S1010. In operation S1011, the next-lowest bit, or the 1st bit is selected, in operation S1012 it is determined that the last bit has not been analyzed, and in operation S1003 the (K−1)th bit is set to 1. At this time, the control bits are 3'b010, and the next comparison corresponding to operations S1004 to S1008 is performed.

Since the frequency corresponding to the control bits of 3'b010 is 7.4 MHz, the count value of the oscillation signal counter during the reference time is 379. Since the count value of 379 is less than the reference data 410, the (K−1)th bit maintained at 1 in operation S1009, and the (K−2)th bit is set to 1 in operation S1003. At this time, the control bits are 3'b011, and the next comparison is performed.

Since the frequency corresponding to the control bits of 3'b011 is 7.8 MHz, the count value of the oscillation signal counter during the reference time is 399. Since the count value of 399 is less than the reference data 410, the (K−2)th bit is maintained at 1 in operation S1009. At this time, the SAR comparison for 3 bits is completed, and the obtained initial control bits are 3'b011. While obtaining the initial control bits, the count value 399 of the oscillation signal counter is stored in the first register 301 of the post process module 300.

Since the count value 399 of the oscillation signal counter under the control of the initial control bits 3'b011 is less than the reference data 410, the adjacent control bits generating module 312 in the post process module 300 generates adjacent control bits according to the comparing result by adding 1 to the initial control bits, that is, the adjacent control bits is equal to 3'b100. Since the frequency corresponding to the adjacent control bits 3'b100 is 8.1 MHz, the count value of the oscillation signal counter corresponding to the frequency 8.1 MHz is 415.

Figure 9:
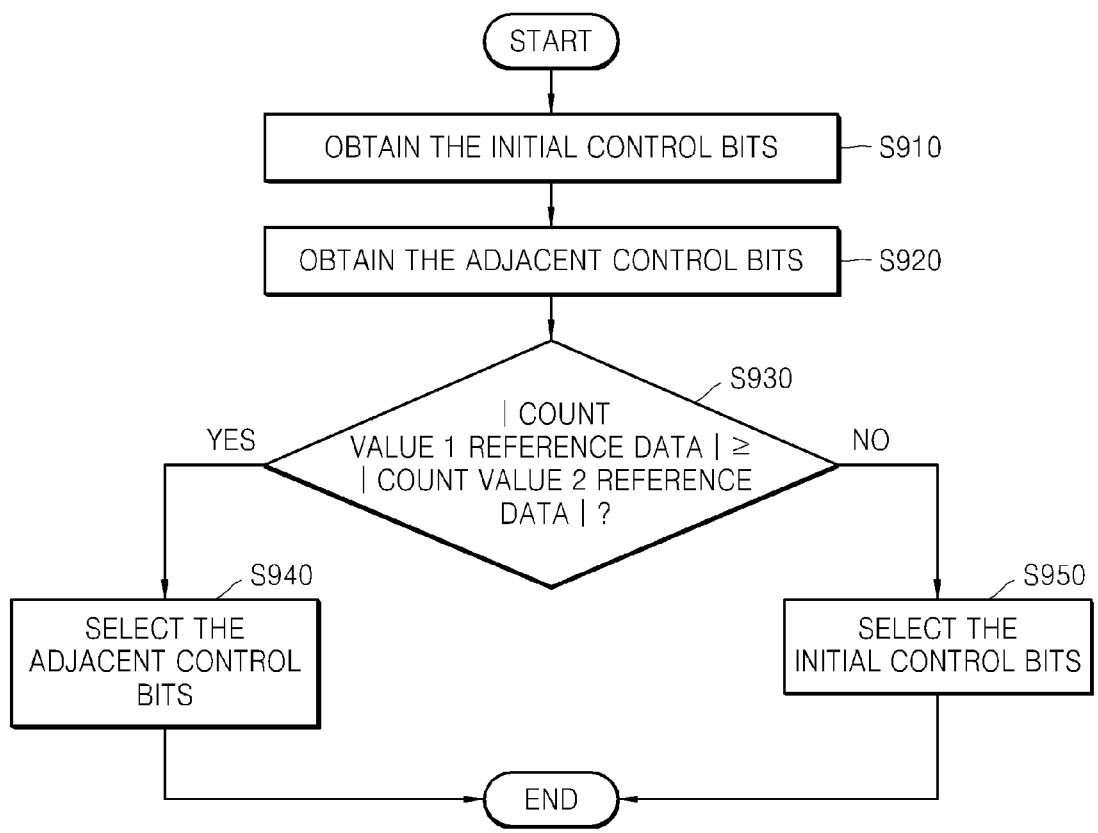
FIG. 9 is a flowchart illustrating an auto-trimming method of an internal oscillator according to an exemplary embodiment of the present general inventive concept.

In other words, referring to FIGS. 8 and 9, the adjacent control bits generating module 312 receives the initial control bits in operation S910 and outputs the generated adjacent control bits 3'b100 to the decoder 600 via the encoder 400 in operation S920 to generate the frequency corresponding to the adjacent control bits. Since the frequency corresponding to the adjacent control bits 3'b100 is 8.1 MHz, the count value of the oscillation signal counter corresponding to the frequency 8.1 MHz is 415. The value (that is, 399) of the first register 301 is transmitted to the second register 302, and then the current count value (that is, the count value corresponding to the adjacent control bits) of the oscillation signal counter is input to the first register 301. At this time, the value in the first register 301 is 415, and the value in second register 302 is 399.

In operation S930, the value in the first register 301 is compared to the value in the second register 302. The first calculator 303 subtracts the reference value from the value in the first register 301, and the absolute value of the subtracted result is (415−410=5). The second calculator 304 subtracts the reference value from the value in the second register 302, and the absolute value of the subtracted result is (410−399=11). Then the two calculated values (that is, 5 and 11) are transmitted to the second comparer 305 and compared with each other, the compared result is that the value stored in the first register 301 is closer to the reference frequency, and thus the adjacent control bits (that is, 3'b100) is selected as the final control bits.

Then, the value in the first register 301 is selected as the final value of the control bits in operation S940, since the difference between the value in the first register 301 and the reference value is less than the difference between the value in the second register 302 and the reference value. The final control bits (that is, 3'b100) are written into the memory 800 via the encoder 400. In particular, the encoder 400 encodes the final control bits by maintaining the highest bit and inverting others bits, and the value written into the memory 800 via the encoder 400 is 3'b100. Since the default value of the memory 800 after it is erased is generally 1, if the process difference in the produce is not significant, the erased value should be close to the target frequency. Therefore, the default value may be applied to cases which require accuracy high degree of accuracy is not required.

The trimming process of the internal oscillator in a case in which the frequency corresponding to the control bits 3'b011 changes from 7.8 MHz to 7.95 MHz will be described by referring to Table 3 in below.

TABLE 3

| control bits | 3'b000 | 3'b001 | 3'b010 | 3'b011 | 3'b100 | 3'b101 | 3'b110 | 3'b111 |
|---|---|---|---|---|---|---|---|---|
| oscillation frequency | 6.4M | 6.9M | 7.4M | 7.95M | 8.1M | 8.5M | 9.0M | 9.6M |
| N | 328 | 353 | 379 | 399 | 415 | 435 | 461 | 492 |

Since K is initially set to a value of 2 to select the highest-level bit, the control bits are set to 3'b100. The control bits of 3'b100 correspond to an oscillation frequency of 8.1 MHz. During the reference time, the count value of the oscillation signal counter is 415. Since the count value of 415 is greater than the reference data 410, the Kth bit is set to 0, and the (K−1)th bit is set to 1. At this time, the control bits are 3'b010, and the next comparison is performed.

Since the frequency corresponding to the control bits of 3'b010 is 7.4 MHz, the count value of the oscillation signal counter during the reference time is 379. Since the count value of 379 is less than the reference data 410, the (K−1)th bit is maintained at 1, and the (K−2)th bit is set to 1. At this time, the control bits are 3'b011, and the next comparison is performed.

Since the frequency corresponding to the control bits of 3'b011 is 7.95 MHz, the count value of the oscillation signal counter during the reference time is 407. Since the count value of 407 is less than the reference data 410, the (K–2)th bit is maintained at 1. At this time, the SAR comparison for 3 bits is completed, and the obtained initial control bits are 3'b011. While obtaining the initial control bits, the count value 407 of the oscillation signal counter is stored in the first register 301 of the post process module 300.

Since the count value 407 of the oscillation signal counter under the control of the initial control bits 3'b011 is less than the reference data 410, the adjacent control bits generating module 312 in the post process module 300 generates adjacent control bits according to the comparing result by adding 1 to the initial control bits, that is, the adjacent control bits is equal to 3'b100.

Since the frequency corresponding to the adjacent control bits 3'b100 is 8.1 MHz, the count value of the oscillation signal counter corresponding to the frequency 8.1 MHz is 415, after comparing, the value (that is, 407) of the first register 301 is firstly transmitted to the second register 302, and then the current count value (that is, the count value corresponding to the adjacent control bits) of the oscillation signal counter to the first register 301. At this time, the value in the first register 301 is 415, and the value in second register 302 is 407. The first calculator 303 subtracts the reference value from the value in the first register 301, and the absolute value of the subtracted result is (415−410=5). The second calculator 304 subtracts the reference value from the value in the second register 302, and the absolute value of the subtracted result is (410−407=3). The two calculated values (that is, 5 and 3) are transmitted to the second comparer 305 and compared with each other, at which time it is determined that the value stored in the second register 302 is closer to the reference frequency, and thus the initial control bits (that is, 3'b011) are selected as the final control bits.

The final control bits (that is, 3'b011) are written in the memory 800 via the encoder 400. In particular, the encoder 400 encodes the final control bits by maintaining the highest bit and inverting others bits, and the value written into the memory 800 via the encoder 400 is 3'b000. Since the default value of the memory 800 after being erased is generally 1, and if no trimming is performed, the value output from the memory 800 is 3'b111, the control bits transmitted to the internal oscillator via the decoder 600 is 3'b100, which is not the optimal result, but is close to the target frequency.

An auto-trimming method of the internal oscillator will be described by referring to FIG. 9 below.

FIG. 9 is a flowchart illustrating the auto-trimming method of the internal oscillator according to exemplary embodiments of the present general inventive concept.

At operation S910, initial control bits are obtained. The initial control bits can be obtained according to the method illustrated in FIG. 3B, and can also be obtained according to the method illustrated in FIG. 10, which will be described in further detail below.

Figure 11:
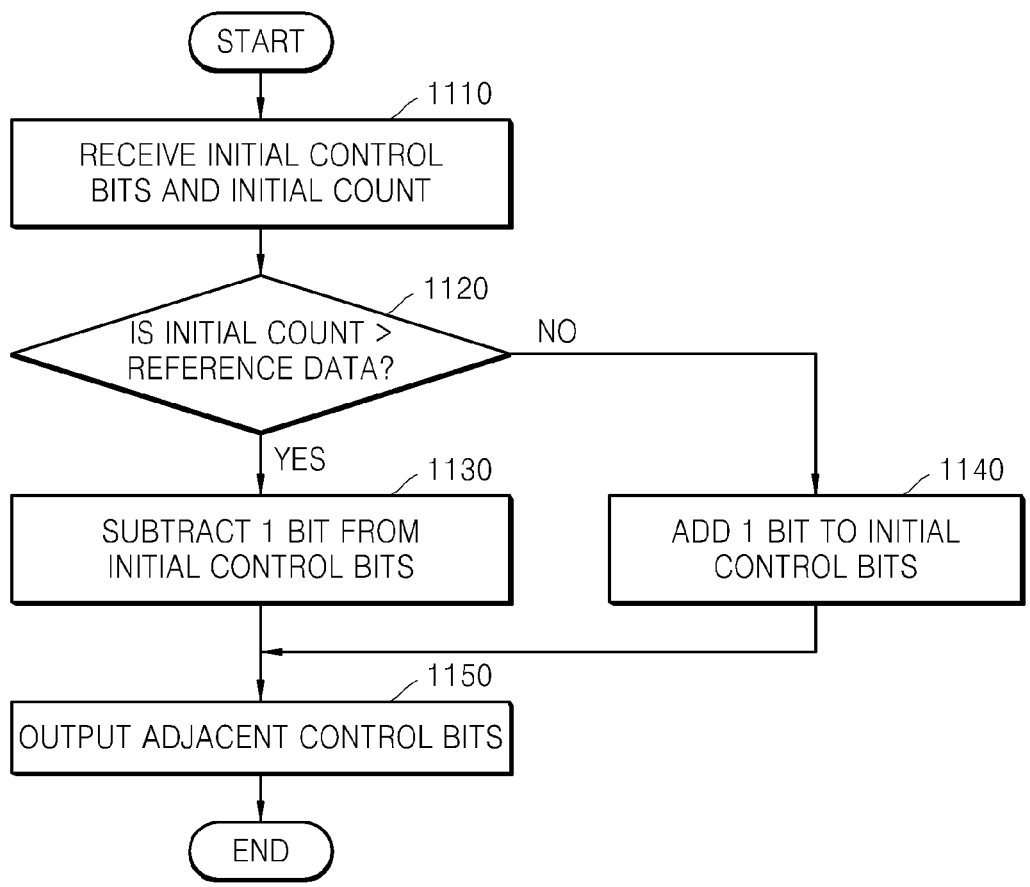
FIG. 11 illustrates determining adjacent bits.

At operation S920, adjacent control bits are obtained. As described by referring to FIG. 8 and FIG. 11, the adjacent control bits generating module 312 obtains the adjacent control bits by comparing a count value corresponding to the initial control bits with the reference data. In particular, in operation 1110 of FIG. 11, the initial control bits and initial count value is received, such as by the post process module 300. In operation 1120, the initial count value is compared to the reference data. If the count value corresponding to the initial control bits is less than or equal to the reference data, the adjacent control bits is obtained by adding 1 to the initial control bits in operation 1140. If the count value corresponding to the initial control bits is greater than the reference data, the adjacent control bits is obtained by subtracting 1 from the initial control bits in operation S1130. The adjacent control bits may be output in operation 1150, such as from the adjacent control bits generating module 312 of FIG. 8 to generate an adjusted signal from the oscillator based on the adjacent control bits.

At operation S930, an absolute value of the difference between a count value (which is referred to as count value 1 in FIG. 9) corresponding to the initial control bits and the reference data is compared with an absolute value of the difference between a count value (which is referred to as count value 2 in FIG. 9) corresponding to the adjacent control bits and the reference data.

If the absolute value of the difference between the count value corresponding to the initial control bits and the reference data is greater than or equal to the absolute value of the difference between the count value corresponding to the adjacent control bits and the reference data, the adjacent control bits are selected as the final control bits at operation S940. If the absolute value of the difference between the count value corresponding to the initial control bits and the reference data is less than the absolute value of the difference between the count value corresponding to the adjacent control bits and the reference data, the initial control bits are selected as the final control bits at operation S950.

In addition, the auto-trimming method of the internal oscillator according to exemplary embodiment of the present general inventive concept can also include a operation of storing the obtained final control bits in the memory 800.

FIG. 10 is a flowchart illustrating the operation S910 for obtaining the initial control bits in FIG. 9.

Steps S1001, S1002, and S1003 in FIG. 10 are similar to operations 41, 42, and 43 illustrated in FIG. 3B, and will not be further described in detail here.

At operation S1004, periods of the reference signal are counted.

At operation S1005, it is determined whether the count value for the period of the reference signal is equal to a predetermined threshold M.

If the count value of the period for the reference signal is less than the predetermined threshold M, periods of the oscillation signal are counted in operation S1006, and then the process returns to operation S1004 for a loop operation, until the count value of the periods for the reference signal is equal to the predetermined threshold M. If the count value of the periods for the reference signal is equal to the predetermined threshold M, the counting for the periods of the oscillation signal stops, and the current count value (hereinafter, the count value is referred to as N) for the periods of the oscillation signal is stored in operation S1007.

The count value N for the periods of the oscillation signal is compared with the reference data in operation S1008, where the reference data is a count value corresponding to a desired frequency.

If the count value N is greater than or equal to the reference data, the Kth bit is maintained to as 1 in operation S1009; if the count value N is less than the reference data, the Kth bit is set to 0 in operation S1010.

Operations S1011 and S1012 FIG. 10 are similar to operations 47 and 48 illustrated in FIG. 3B, and a detailed description of these operations is omitted here.

Figure 12:
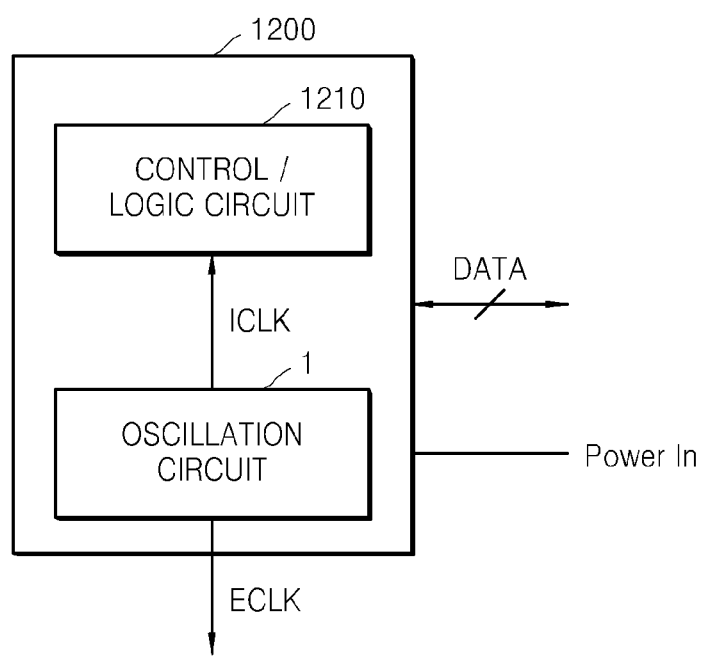
FIG. 12 illustrates a microchip including an oscillation circuit.

FIG. 12 illustrates a microchip 1200 or other integrated circuit including the oscillation circuit 1 of FIG. 4. The microchip 1200 may include one or more control and logic circuits 1210, such as processors or other supporting logic. The microchip 1200 may further include memory (not shown). The microchip may receive a power in, and may input and output data. The oscillation circuit 1 may be powered by the chip power, and may not require additional inputs to generate a desired frequency. For example, the data lines may be used to select a desired frequency of the oscillation circuit 1. The oscillation circuit 1 may generate a clock signal ICLK that is internal to the microchip 1200, or the oscillation circuit 1 may generate an external clock signal ECLK to output from the microchip 1200.

Compared with conventional techniques, the high-accuracy oscillator and the auto-trimming (that is, auto calibrating) method according to an exemplary embodiment of the general inventive concept can improve the accuracy of the frequency of the obtained oscillation signal by further processing the obtained initial control bits. Meanwhile, since the high accuracy oscillator according to exemplary embodiment of the general inventive concept employs the internal oscillator and does not need to connect to an external oscillator element, no pin for external connecting is need, which is convenient for integration and costs will be reduced.

While the general inventive concept has been shown and described with reference to certain exemplary embodiments thereof, it will be understood by those skilled in the art that various changes in form and details may be made therein without departing from the spirit and scope of the general inventive concept as defined by claims.

Although a few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. An oscillator, comprising:
an oscillator unit, which generates an oscillation signal;
a frequency comparer, which receives the oscillation signal from the oscillator unit, and compares the frequency of a preset reference signal and the frequency of the oscillation signal based on a preset reference data, the preset reference data corresponding to a target frequency;
a Successive-Approximation-Register (SAR) comparer, which obtains initial control bits to control a frequency of the oscillator unit based on the comparing result of the frequency comparer; and
a post process module, which generates adjacent control bits based on the initial control bits, selects one of the initial control bits and adjacent control bits as final control bits based on a comparison of the preset reference data with the initial control bits and the adjacent control bits, and outputs the final control bits to the oscillator unit,
wherein the oscillator unit performs auto-trimming based on the final control bits.

2. The oscillator of claim 1, wherein the frequency comparer includes:
a reference signal counter, which counts periods of the reference signal;
an oscillation signal counter, which counts periods of the oscillation signal until the count value of the reference signal counter reaches the predetermined threshold M, and outputs a current count value; and
a comparing unit, which receives the count value from the oscillation signal counter and compares the count value with the preset reference data.

3. The oscillator of claim 2, wherein the SAR comparer obtains the initial control bits by performing the following operations:
setting all bits from a 0th bit to a Kth bit to 0, setting the variable K=N−1, and setting the Kth control bit to 1, where N indicates a number of the control bits of the oscillator unit;
setting the Kth control bit according to comparing result of the comparing unit such that, if the comparing result of the comparing unit is that the count value of the oscillation signal counter is greater than or equal to the preset reference data, the Kth control bit is maintained as 1, and if the comparing result of the comparing unit is that the count value of the oscillation signal counter is less than the preset reference data, the Kth control bit is set to 0;
setting K=K−1; and
if K is greater than or equal to 0, repeating the operations of setting the Kth bit to 1, comparing the count value to the preset reference data, maintaining or setting the Kth bit to 1 or 0, respectively, and setting K=K−1.

4. The oscillator of claim 1, wherein the SAR comparer obtains the initial control bits by performing the following operations:
setting all bits from a 0th bit to a Kth bit to 0, setting the variable K=N−1, and setting the Kth control bit to 1, where N indicates a number of the control bits of the oscillator unit;
comparing the frequency of the oscillation signal and the frequency of the reference signal;
if the frequency of the oscillation signal is greater than the frequency of the reference signal, maintaining the Kth control bit as 1, and if the frequency of the oscillation signal is less than the frequency of the reference signal, setting the Kth control bit to 0;
setting K=K−1; and
if K is greater than or equal to 0, repeating the operations of setting the Kth control bit to 1, comparing the oscillation signal frequency and the reference signal frequency, maintaining or setting the Kth bit to 1 or 0, respectively, and setting K=K−1.

5. The oscillator of claim 2, wherein the post process module includes:
a first comparer, which receives the count value from the oscillation signal counter in the frequency comparer, and compares the count value with the preset reference data;
an adjacent control bits generating module, which generates the adjacent control bits by subtracting 1 from the initial control bits if the comparing result is that the count value is greater than the preset reference data, and generates the adjacent control bits by adding 1 to the initial control bits if the comparing result is that the count value is less than or equal to the preset reference data;
a first register, which receives and stores the counter value of the oscillation signal counter corresponding to the initial control bits from the oscillation signal counter, transmits the stored count value to a second register when a predetermined time period after receiving the count value elapses, and receives the counter value of the oscillation signal counter corresponding to the adjacent control bits from the oscillation signal counter;
the second register, which receives and stores the counter value of the oscillation signal counter corresponding to the initial control bits from the first register;
a first calculator, which calculates an absolute value of a difference between the count value of the oscillation signal counter corresponding to the adjacent control bits and the preset reference data;

a second calculator, which calculates an absolute value of a difference between the count value of the oscillation signal counter corresponding to the initial control bits and the preset reference data; and a second comparer, which compares values output from the first calculator and the second calculator, wherein if the value output from the first calculator is less than the value output from the second calculator, the adjacent control bits are selected as the final control bits, and if the value output from the first calculator is greater than or equal to the value output from the second calculator, the initial control bits are selected as the final control bits.

6. The oscillator of claim 2, wherein the preset reference data is set as follows: Refdata=$|M \times T_{REF}/T_{TAG}|$, wherein Refdata denotes the reference data, and is an integer, $T_{REF}$ denotes a period of the reference signal, $T_{TAG}$ denotes a target period of the oscillation signal, and M denotes a predetermined threshold.

7. The oscillator of claim 1, further comprising:
an encoder, which encodes the final control bits output by the post process module;
a memory, which stores the encoded final control bits;
a selector, which selects a source of the selected final control bits, so that the oscillator obtains a desired frequency in a no-trimming status;
a decoder, which decodes the final control bits output from the selector, and outputs the decoded final control bits to the oscillator unit.

8. The oscillator of claim 7, wherein if the high accuracy oscillator is in a trimming status, the selector receives the encoded final control bits from the encoder, and if the high accuracy oscillator is in a no-trimming status, the selector receives the final control bits from the memory.

9. An auto-trimming method of an oscillator, the method comprising:
comparing a frequency of a preset reference signal and a frequency of an oscillation signal based on a preset reference data, the preset reference data corresponding to a target frequency of the oscillation signal;
generating initial control bits based on the comparison result; and
selecting one of the initial control bits and adjacent control bits as final control bits by comparing a first difference between the initial control bits and the preset reference data and a second difference between the adjacent control bits and the preset reference data,
wherein an oscillator unit performs auto-trimming based on the final control bits.

10. The auto-trimming method of claim 9, wherein comparing the frequency of a preset reference signal and the frequency of an oscillation signal based on the preset reference data includes:
counting periods of the reference signal by a reference signal counter;
counting periods of the oscillation signal by an oscillation signal counter, until the count value of the reference signal counter reaches a predetermined threshold M, and outputting a current count value by the oscillation signal counter;
receiving the count value from the oscillation signal counter, and comparing the count value with the preset reference data.

11. The auto-trimming method of claim 10, wherein generating the initial control bits includes:

setting a variable K=N−1, wherein N indicates a number of control bits of the oscillator unit, setting the Kth control bit to 1, and setting all bits of the 0th bit through the (K−1)th bit to 0;
setting the Kth control bit according to the comparing result of the comparing step such that if the comparing result of the comparing unit is that the count value of the oscillation signal counter is greater than or equal to the preset reference data, maintaining the Kth control bit as 1, and if the comparing result of the comparing unit is that the count value of the oscillation signal counter is less than the preset reference data, setting the Kth control bit to 0;
setting K=K−1; and
if K is greater than or equal to 0, repeating the operations of setting the Kth control bit to 1, and setting the Kth control bit according to the comparing result.

12. The auto-trimming method of claim 9, wherein generating the initial control bits includes:
setting a variable K=N−1, where N indicates a number of the control bits of the oscillator unit setting the Kth control bit to 1, and setting all bits of the 0th bit through the (K−1)th bit to 0;
comparing the frequency of the oscillation signal and the frequency of the reference signal;
if the frequency of the oscillation signal is greater than the frequency of the reference signal, maintaining the Kth control bit as 1, and if the frequency of the oscillation signal is less than the frequency of the reference signal, setting the Kth control bit to 0;
letting K=K−1; and
if K is greater than or equal to 0, repeating the operations of setting the Kth control bit to 1, and setting the Kth control bit according to the comparing result.

13. The auto-trimming method of claim 10, wherein generating the adjacent control bits includes:
receiving the count value from the oscillation signal counter, and comparing the count value with the preset reference data; and
generating the adjacent control bits by subtracting 1 from the initial control bits if the comparing result is that the count value is greater than the preset reference data, and generating the adjacent control bits by adding 1 to the initial control bits if the comparing result is that the count value is less than or equal to the preset reference data.

14. The auto-trimming method of claim 10, wherein selecting the final control bits includes:
calculating an absolute value of a difference between the count value of the oscillation signal counter corresponding to the initial control bits and the preset reference data, and calculating an absolute value of a difference between the count value of the oscillation signal counter corresponding to the adjacent control bits and the preset reference data;
comparing the two absolute values; and
if the absolute value of the difference between the count value of the oscillation signal counter corresponding to the initial control bits and the preset reference data is less than or equal to the absolute value of the difference between the count value of the oscillation signal counter corresponding to the adjacent control bits and the preset reference data, selecting the initial control bits as the final control bits, and if the absolute value of the difference between the count value of the oscillation signal counter corresponding to the initial control bits and the preset reference data is greater than the absolute value of the difference between the count value of the oscillation signal counter corresponding to the adjacent control bits and the preset reference data, selecting the adjacent control bits as the final control bits.

15. The auto-trimming method of claim 10, further comprising:
encoding the final control bits by an encoder;
storing the encoded final control bits by a memory;
selecting the final control bits from the encoder and the memory by a selector, so that the oscillator obtains a desired frequency in a no-trimming status; and
decoding the final control bits output from the selector, and outputting the decoded final control bits to the oscillator.

16. The auto-trimming method of claim 15, wherein if the high accuracy oscillator is in a trimming status, the selector receives the encoded final control bits from the encoder, and if the high accuracy oscillator is in a no-trimming status, the selector receives the final control bits from the memory.

17. The auto-trimming method of claim 10, wherein the preset reference data is set as follows: Refdata=$|M \times T_{REF}/T_{TAG}|$, wherein Refdata denotes the reference data, and is an integer, $T_{REF}$ denotes a period of the reference signal, $T_{TAG}$ denotes a target period of the oscillation signal, and M denotes the predetermined threshold.

18. A method of controlling an oscillator, the method comprising:
determining initial control bits to generate an initial frequency by counting oscillation periods of the oscillator over a predetermined period of time;
generating adjacent control bits by changing a value of the initial control bits by one bit;
determining which of the initial frequency and an adjusted frequency corresponding to the adjacent control bits is closer to a target frequency of the oscillation signal; and
setting the closer of the initial frequency and the adjusted frequency as an operating frequency of the oscillator,
wherein determining which of the initial frequency and the adjusted frequency is closer to the target frequency comprises:
generating an adjusted oscillation signal with the adjacent control bits;
counting an adjusted number of oscillation periods over the predetermined period of time;
calculating an absolute value of the preset count number subtracted from the number of counted oscillation periods corresponding to the initial control bits; and
obtaining an absolute value of the preset count number subtracting the adjusted number of oscillation periods.

19. The method of claim 18, wherein determining the initial control bits comprises:
setting highest level control bit to a value of 1 and each of other control bits to a value of 0 in order from second highest-level to lowest-level control bit;
generating a signal corresponding to the set control bit; and
determining whether to maintain the set control bit at 1 or to change the control bit to 0 by comparing the counted oscillation periods of the generated signal with a predetermined number of oscillation periods.

20. The method of claim 18, wherein generating adjacent control bits includes comparing the number of counted oscillation periods with a preset count number corresponding to the target frequency, and
adding a bit to the initial control bits when it is determined that the number of counted oscillation periods is less than or equal to the preset count number, and subtracting a bit from the initial control bits when it is determined that the number of counted oscillation periods is greater than the preset count number.

21. A method of controlling an oscillator, the method comprising:
setting highest-level control bit to a value of 1 and each of other control bits to a value of 0 in order from second highest-level to lowest-level control bit, respectively, where the control bits control a frequency of a signal output from the oscillator;
generating a signal corresponding to the set control bit; and
determining whether to maintain the set control bit at 1 or to change the control bit to 0 by comparing the number of counted oscillation periods of the generated signal with a predetermined number of oscillation periods,
wherein determining whether to maintain the set control bit at 1 or to change the control bit to 0 comprises:
setting a threshold number to correspond to a target frequency;
counting a number of periods of a reference signal and generating the signal corresponding to the set control bit while the number of periods of the reference signal is less than the threshold number, and determining the number of counted oscillation periods of the generated signal when the counted number of periods of the reference signal reaches the threshold number;
comparing the number of counted oscillation periods of the generated signal with a preset number corresponding to the target frequency; and
maintaining the set bit as a 1 when the number of counted oscillation periods of the generated signal is greater than or equal to the preset number, and setting the set bit to 0 when the number of counted oscillation periods of the generated signal is greater than the preset number.

22. An oscillator circuit, comprising:
an oscillator;
a frequency comparer to compare a frequency of a preset reference signal and a frequency of an oscillation signal based on a preset reference data, the preset reference data corresponding to a target frequency of the oscillation signal;
a Successive-Approximation-Register (SAR) comparer to determine initial control bits to generate an initial frequency according to the comparison result; and
a post process module to generate adjacent control bits by changing a value of the initial control bits by one bit, to determine which of the initial frequency and an adjusted frequency corresponding to the adjacent control bits is closer to a target frequency, and to set the closer of the initial frequency and the adjusted frequency as an operating frequency of the oscillator.

23. The oscillator circuit of claim 22, wherein the post process module comprises:
an adjacent control bits generating module to receive the initial control bits and to output the adjacent control bits;
a first calculator to calculate an absolute value of a difference between the counted number of oscillation periods of the signal output by the oscillator and a preset number corresponding to the target frequency;
a second calculator to calculate an absolute value of a difference between an adjusted counted number of oscillation periods of an adjusted signal output by the oscillator corresponding to the adjacent control bits and the preset number; and
a comparer to determine which of the calculated absolute values is smaller and to output one of the initial control bits and the adjacent control bits according to the determination of which of the calculated absolute values is smaller.

24. A microchip, comprising:

an oscillator circuit including an oscillator, a frequency comparer to compare a frequency of a preset reference signal and a frequency of an oscillation signal based on a preset reference data, the preset reference data corresponding to a target frequency of the oscillation signal, and a Successive-Approximation-Register (SAR) comparer to determine initial control bits to generate an initial frequency according to the comparison result; and a post process module to generate adjacent control bits by changing a value of the initial control bits by one bit, to determine which of the initial frequency and an adjusted frequency corresponding to the adjacent control bits is closer to a target frequency, and to set the closer of the initial frequency and the adjusted frequency as an operating frequency of the oscillator.

* * * * *